US009360496B2

(12) United States Patent
Naumann (10) Patent No.: US 9,360,496 B2
(45) Date of Patent: Jun. 7, 2016

(54) THREE-AXIS MICROELECTROMECHANICAL SYSTEMS DEVICE WITH SINGLE PROOF MASS (71) Applicant: FREESCALE SEMICONDUCTOR, INC., Austin, TX (US)

(72) Inventor: Michael Naumann, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 14/506,022

(22) Filed: Oct. 3, 2014

(65) Prior Publication Data

US 2016/0097792 A1 Apr. 7, 2016

(51) Int. Cl.
*G01C 19/00* (2013.01)
*G01P 15/125* (2006.01)
*B81B 3/00* (2006.01)

(52) U.S. Cl.
CPC ............... *G01P 15/125* (2013.01); *B81B 3/007* (2013.01); *B81B 3/0021* (2013.01); *B81B 2201/0235* (2013.01)

(58) Field of Classification Search
CPC ...................................................... G01C 19/00
USPC ....................................................... 73/504.02
See application file for complete search history.

(56) References Cited

U.S. PATENT DOCUMENTS

| 6,845,670 | B1 | 1/2005 | McNeil et al. | |
|---|---|---|---|---|
| 8,567,248 | B2 * | 10/2013 | Gotoh | G01C 19/5719 73/504.15 |
| 9,097,524 | B2 * | 8/2015 | Seeger | G01C 19/5755 |
| 2001/0039834 | A1 * | 11/2001 | Hsu | G01C 19/5719 73/504.02 |
| 2003/0110858 | A1 * | 6/2003 | Kim | G01C 19/5762 73/504.02 |
| 2012/0216616 | A1 * | 8/2012 | Schultz | G01P 15/125 73/514.38 |
| 2013/0019677 | A1 * | 1/2013 | Coronato | G01C 19/5712 73/504.02 |
| 2013/0192369 | A1 * | 8/2013 | Acar | G01P 15/18 73/514.01 |
| 2014/0217929 | A1 * | 8/2014 | Lin | H02N 1/006 318/116 |

OTHER PUBLICATIONS

Hongwei Qu, et al.; "A Monolithic CMOS-MEMS 3-Axis Accelerometer With a Low-Noise, Low-Power Dual-Chopper Amplifier", IEEE sensors Journal, vol. 8, Issue 9, Sep. 2008.

* cited by examiner

*Primary Examiner* — Lisa Caputo
*Assistant Examiner* — Jamel Williams
(74) *Attorney, Agent, or Firm* — Charlene R. Jacobsen

(57) ABSTRACT

A microelectromechanical systems (MEMS) device, such as a three-axis MEMS device can sense acceleration in three orthogonal axes. The MEMS device includes a single proof mass and suspension spring systems that movably couple the proof mass to a substrate. The suspension spring systems include translatory spring elements and torsion spring elements. The translatory spring elements enable translatory motion of the proof mass relative to the substrate in two orthogonal directions that are parallel to the plane of the MEMS device in order to sense forces in the two orthogonal directions. The torsion spring elements enable rotation of the proof mass about a rotational axis in order to sense force in a third direction that is orthogonal to the other two directions. The translatory spring elements have asymmetric stiffness configured to compensate for an asymmetric mass of the movable element used to sense in the third direction.

20 Claims, 5 Drawing Sheets

THREE-AXIS MICROELECTROMECHANICAL SYSTEMS DEVICE WITH SINGLE PROOF MASS

TECHNICAL FIELD OF THE INVENTION

The present invention relates generally to microelectromechanical systems (MEMS) devices. More specifically, the present invention relates to a three-axis MEMS accelerometer having a single proof mass.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems.

One example of a MEMS sensor is a MEMS accelerometer. MEMS accelerometers are sensitive to acceleration and may be configured to sense acceleration forces along one, two, or three axes or directions. One common form of MEMS accelerometer uses one or more movable structures that move under acceleration above a substrate. The movement of the movable structure changes capacitance, and an electrical circuit connected to the MEMS accelerometer structure measures the change in capacitance to determine the acceleration forces.

In order to sense motion along multiple axes, accelerometers may include multiple movable structures that move independently of one another in response to accelerations. As these devices continue to shrink in size, it becomes desirable to reduce the collective size of these movable structures. But reducing the collective size of the movable structures can make it increasingly difficult to meet predetermined sensitivity and reliability requirements. In addition, due to smaller sizes and travel distances of the movable structures, some MEMS accelerometers can be vulnerable to high impact loads.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail microelectromechanical systems (MEMS) devices with small form factors and enhanced reliability and/or sensitivity. These MEMS devices can include transducers such as MEMS accelerometers. More particularly, embodiments described herein entail MEMS accelerometer devices capable of sensing acceleration in three orthogonal directions (e.g., X-direction, Y-direction, and Z-direction) defined by three orthogonal axes (e.g., X-axis, Y-axis, and Z-axis). In general, the embodiments described herein can provide relatively small device size by facilitating the sharing of a single proof mass for sensing in all three directions. Furthermore, the embodiments described herein can provide this relatively small device size while still providing relatively good sensitivity. This sensitivity can be provided by decoupling the sense motions in two directions (e.g., the X-direction and the Y-direction). This decoupling is facilitated by the use of translatory spring elements that have asymmetric stiffness configured to compensate for an asymmetric mass used to sense in the third direction (e.g., the Z-direction).

In general, coupled sense motion refers to a condition in which an acceleration signal in one main axis direction causes displacement of a proof mass in that main axis, thereby leading to a capacitance change along the main axis. Additionally, with coupled sense motion, the acceleration signal in the main axis direction causes some amount of displacement of the proof mass in at least one cross axis direction thereby leading to a capacitance change along the cross (i.e., orthogonal) axis. Some accelerometers are configured for coupled sense motion as part of the normal device operation. Accelerometers with coupled sense motions typically operate either based on the assumption that the cross axis signals are smaller than main axis signals and can therefore be neglected/tolerated for a certain application or electrode signals are combined in a way that the cross axis signals cancel under ideal geometrical and operational conditions.

Embodiments described herein decouple sense motion in two directions (e.g., the X-direction and the Y-direction) so that sensing displacement in the MEMS accelerometer caused by acceleration in the X-direction will cause displacement relative to electrodes used to sense acceleration in the X-direction, but will not cause significant displacement relative to electrodes used to sense in the Y-direction. Likewise, sensing displacement in the MEMS accelerometer caused by acceleration in the Y-direction will cause displacement relative to electrodes used to sense acceleration in the Y-direction, but will not cause significant displacement relative to electrodes used to sensing in the X-direction.

Figure 1:
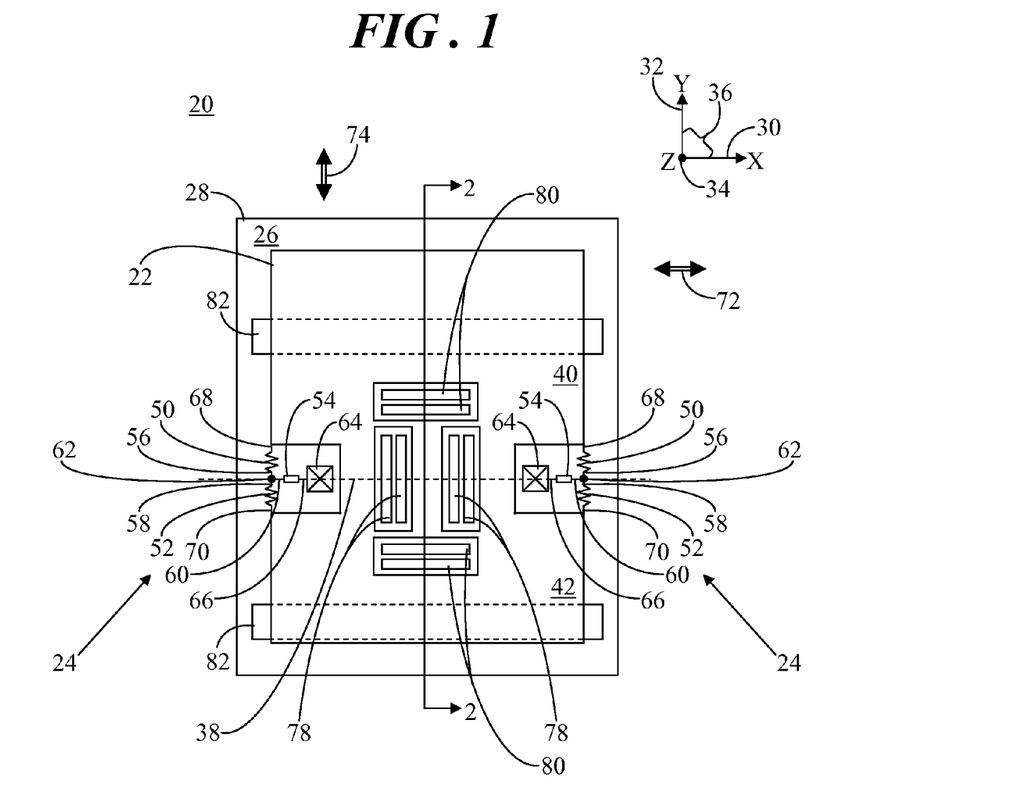
FIG. 1 shows a schematic top view of a microelectromechanical systems (MEMS) device in accordance with an exemplary embodiment.
Figure 2:
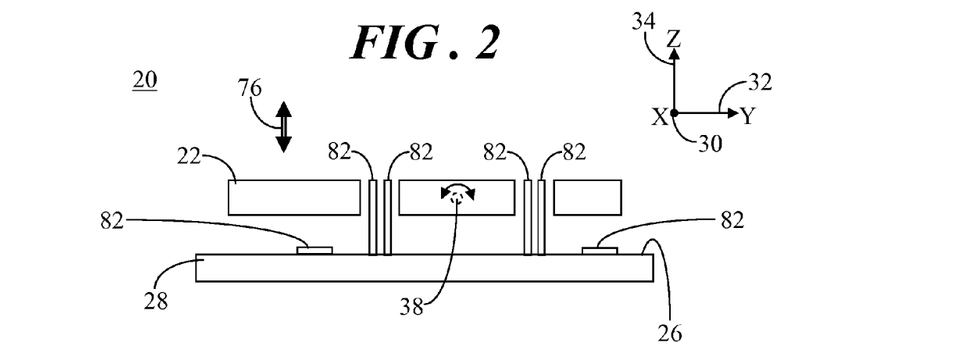
FIG. 2 shows a cross-sectional side view of the MEMS device along section lines 2-2 of FIG. 1.

Referring to FIGS. 1 and 2, FIG. 1 shows a schematic top view of a MEMS device 20 in accordance with an exemplary embodiment and FIG. 2 shows a cross-sectional side view of MEMS device 20 along section lines 2-2 of FIG. 1. MEMS device 20 generally includes a movable element, referred to herein as a proof mass 22 and two suspension spring systems 24 configured to movably couple proof mass 22 to a surface 26 of a substrate 28.

In the top view illustration of FIG. 1, a three-dimensional coordinate system is represented in which an X-axis 30 is directed rightward and leftward on the page, a Y-axis 32 is directed upward and downward on the page, and a Z-axis 34 is directed into the page. Correspondingly, in the side view illustration of FIG. 2, the three-dimensional coordinate system is represented in which X-axis 30 is directed into the page, Y-axis 32 is directed rightward and leftward on the page, and Z-axis 34 is directed upward and downward on the page. Together, X-axis 28 and Y-axis 30 define an X-Y plane 36, and surface 26 of substrate 28 is generally parallel to X-Y plane 36.

As will be discussed in significantly greater detail below, suspension spring systems 24 enable translatory motion of proof mass 22 in response to acceleration forces in directions that are substantially parallel to either of X-axis 28 and Y-axis 30. Additionally, proof mass 22 has asymmetric mass relative to a rotational axis 38. That is, a first portion 40 and a second portion 42 of proof mass 22 are disposed on opposing sides of rotational axis 38. In the illustrated embodiment, first portion 40 of proof mass 22 has greater mass than second portion 42. This can be accomplished, in some embodiments, by offsetting rotational axis 38 away from a geometric center of proof mass 22. Accordingly, suspension spring systems 24 further enable rotational motion of proof mass 22 about rotational axis 38 in response to acceleration force in a direction that is substantially parallel to Z-axis 34.

Each suspension spring system 24 includes a first translatory spring element 50, a second translatory spring element 52, and a torsion spring element 54. First translatory spring element 50 includes a first end 56, second translatory spring element 52 includes a second end 58, and torsion spring element 54 includes a first torsion spring end 60. First end 56, second end 58, and first torsion spring end 60 are coupled together, or conjoined, at a common region 62, or location, suspended above surface 26 of substrate 28.

In the illustrated configuration, anchor elements 64 are coupled to substrate 28 at rotational axis 38 for proof mass 22. Each torsion spring element 54 includes a second torsion spring end 66 coupled to its adjacent one of anchor elements 64. Additionally, each first translatory spring element 50 includes a third end 68 coupled with first portion 40 of proof mass 22, and each second translatory spring element 52 includes a fourth end 70 coupled with second portion 42 of proof mass 22. It should be understood that the terms "first," "second," "third," "fourth," and so on used herein do not refer to a sequential ordering or prioritization of the elements of MEMS device 20. Instead, the terms "first," "second," "third," "fourth," and so on are used to distinguish the various elements from one another for clarity of description.

First and second translatory spring elements 50 and 52 of spring suspension systems 24 facilitate translatory motion of proof mass 22. This translatory motion includes motion in a first direction, referred to herein as an X-direction 72 parallel to X-axis 30 and motion in a second direction, referred to herein as a Y-direction 74 parallel to Y-axis 32. This translatory motion of proof mass 22 is used to detect acceleration in the corresponding X-direction 72 and Y-direction 74 substantially parallel to surface 26 of substrate 28. Torsion spring elements 54 of spring suspension systems 24 facilitate teeter-totter like rotation of proof mass 22 about rotational axis 38. The asymmetric mass and rotation about rotational axis 38 enables proof mass 22 to detect acceleration in a third direction, referred to herein as a Z-direction 76 parallel to Z-axis 34 and orthogonal to surface 26 of substrate 28.

In an embodiment, each of first translatory spring elements 50 has a first stiffness and each of second translatory spring elements 52 has a second stiffness. The first stiffness of each first translatory spring element 50 is greater than the second stiffness of the corresponding second translatory spring element 52 to compensate for moments created by the asymmetric mass of proof mass 22. Specifically, the stiffness difference can compensate for moments cause by translatory acceleration in a first direction defined by a first axis, where the first direction and first axis are orthogonal to the asymmetry. In the illustrated example, acceleration in the first direction corresponds to acceleration in X-direction 72 parallel to X-axis 30. Thus, first translatory spring elements 50 facilitate translatory motion of first portion 40 of proof mass 22 and second translatory spring element 52 facilitate translatory motion of second portion 42 of proof mass such that proof mass 22 moves substantially linearly (i.e., without twisting) in response to acceleration in X-direction 72. Accordingly, the compensation provided by the stiffness difference can facilitate accurate determination of acceleration in X-direction 72, without that determination being distorted by the asymmetric mass of proof mass 22.

MEMS device 20 further includes first electrodes 78, second electrodes 80, and third electrodes 82. As mentioned previously, MEMS device 20 is configured to determine the force applied by acceleration in any of three orthogonal directions (i.e., X-direction 72, Y-direction 74, and Z-direction 76 as defined by the corresponding X-axis 30, Y-axis 32, and Y-axis 34).

First and second electrodes 78 and 80, respectively, are coupled to surface 26 of substrate 28 and can be disposed in openings extending through proof mass 22. First electrodes 78 are used to detect acceleration in X-direction 72 as a change in capacitance between first electrodes 78 and proof mass 22. Similarly, second electrodes 80 are used to detect acceleration in Y-direction 74 as a change in capacitance between second electrodes 80 and proof mass 22. First and second electrodes 78 and 80 are positioned as close to rotational axis 38 as possible in order to minimize the cross coupling of sense signals between rotational motion of proof mass 22 and displacements of proof mass 22 in X-direction 72 and/or Y-direction 74.

Again, the motion of proof mass 22 is additionally based upon a teeter-totter principal of operation for differential signal evaluation in order to detect acceleration in Z-direction 76 substantially parallel to Z-axis 34. Accordingly, third electrodes 82 are formed on surface 26 of substrate 28 underlying proof mass 22 on opposing sides of rotational axis 38. Third electrodes 82 are used to detect acceleration in Z-direction 76 as a change in capacitance between third electrodes 82 and proof mass 22. Third electrodes 82 are positioned as far away from rotational axis 38 as possible, and are displaced away from rotational axis 38 by an equivalent distance. The displaced position of third electrodes 82 results in greater gap width changes as proof mass 22 rotates, relative to locations that are closer to rotational axis 38, so as to yield relatively high changes in capacitance and thereby enhanced sensitivity.

Figure 3:
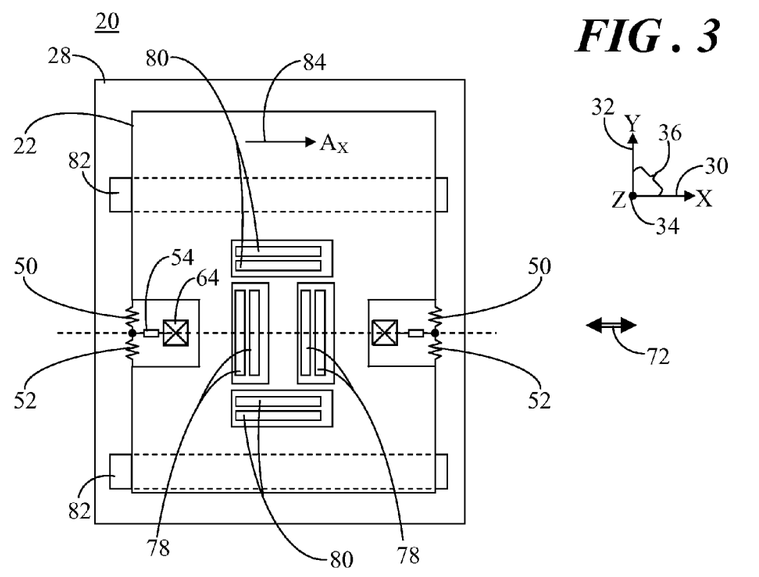
FIG. 3 shows a top view of the MEMS device being subjected to an acceleration force in a first direction.

FIG. 3 shows a top view of MEMS device 20 being subjected to an acceleration force 84, labeled $A_X$, in a first direction, e.g., X-direction 72. In this illustration, acceleration force 84 causes translatory motion of proof mass 22 in X-direction 72. This translatory motion is facilitated by translatory spring elements 50 and 52. It should be noted that because proof mass 22 has asymmetric mass with respect to X-axis 30, acceleration force 84 in X-direction 72 will result in the creation of rotational moments on proof mass 22. However, these rotational moments created by the asymmetry are compensated for by the asymmetric stiffness of translatory spring elements 50 and 52 in X-direction 72. This facilitates the correct translatory motion of proof mass 22, and in particular, linear motion of proof mass 22 generally parallel to X-axis 30, in response to acceleration force 84 in X-direction 72.

The translatory motion of proof mass 22 in X-direction 72 causes changes in the distance between proof mass 22 and first electrodes 78. It should also be noted that the motion of proof mass 22 caused by acceleration force 84 in X-direction 72 is substantially perpendicular to the length of first electrodes 78. Such an arrangement can provide high device sensitivity for measurement of acceleration force 84 in X-direction 72, as the capacitance changes are greatest with motion that causes this linear motion with little or no twisting or rotation of proof mass 22. Thus, the changes in the distances between first electrodes 78 and proof mass 22 cause a relatively large change in capacitances, and these changes in capacitance are used to determine a measure of acceleration force 84 or some other force being applied in X-direction to MEMS device 20.

Figure 4:
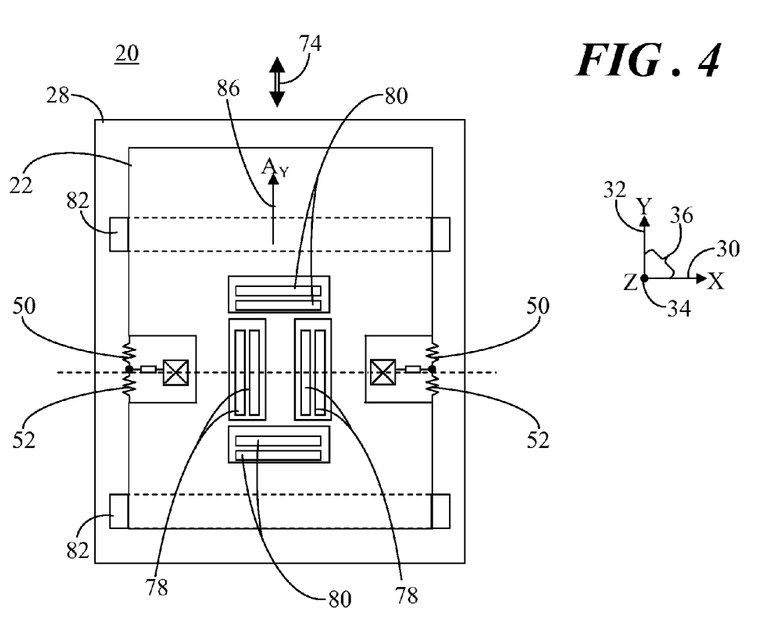
FIG. 4 shows a top view of the MEMS device of FIG. 1 being subjected to an acceleration force in a second direction.

FIG. 4 shows a top view of MEMS device 20 being subjected to an acceleration force 86, labeled $A_Y$, in a second direction, e.g., Y-direction 74. In this illustration, acceleration force 86 causes translatory motion of proof mass 22 in Y-direction 74. Again, this translatory motion is facilitated by translatory spring elements 50 and 52. It should be noted that in this embodiment, proof mass 22 has symmetric mass with respect to Y-axis 32. Thus, acceleration force 86 in Y-direction 74 will not result in the significant rotational or twisting moments on proof mass 22. For this reason, translatory spring elements 50 and 52 can have substantially symmetric stiffness in Y-direction 74, and acceleration force 86 in Y-direction 74 will still cause the correct translatory motion of proof mass 22, and in particular, linear motion of proof mass 22 generally parallel to Y-axis 32, in response to acceleration force 86 in Y-direction 74.

The translatory motion of proof mass 22 in Y-direction 74 changes the distances between proof mass 22 and second electrodes 80. Again, it should also be noted that the motion of proof mass 22 caused by acceleration force 86 in Y-direction 74 is substantially perpendicular to the length of second electrodes 80. Such an arrangement can provide high device sensitivity for measurement of acceleration force 86 in Y-direction 74, as the capacitance changes are greatest with motion that causes this linear motion with little or no twisting or rotation of proof mass 22. Thus, the changes in the distances between second electrodes 80 and proof mass 22 cause a relatively large change in capacitances, and these changes in capacitance are used to determine a measure of acceleration force 86 or some other force being applied in X-direction to MEMS device 20.

Figure 5:
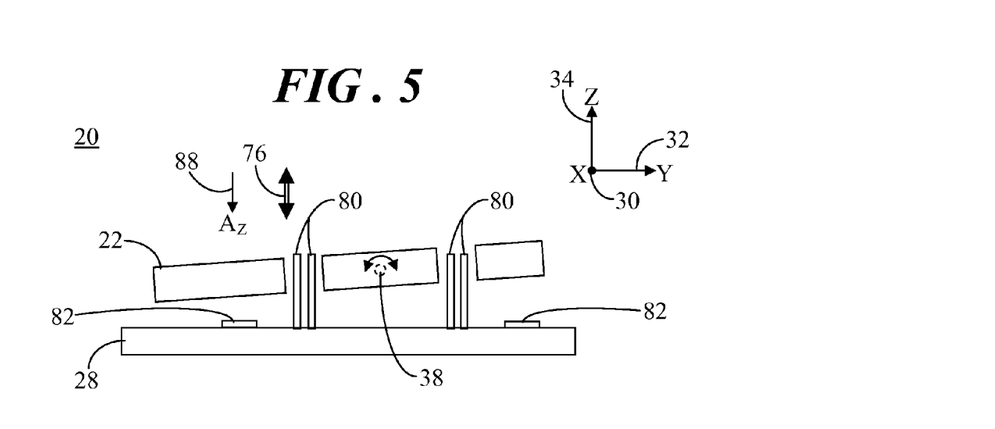
FIG. 5 shows a cross-sectional side view of the MEMS being subjected to an acceleration force in a third direction.

FIG. 5 shows a cross-sectional side view of MEMS device 20 being subjected to an acceleration force 88, labeled $A_Z$, in a third direction, e.g., Z-direction 76. Because proof mass 22 has asymmetric mass with respect to its rotational axis 38, e.g., X-axis 30, acceleration force 88 causes proof mass 22 to rotate about rotational axis 38. This rotational motion about rotational axis 38 is facilitated by torsion spring elements 54 (FIG. 1). This rotational motion of proof mass 22 causes changes in the distances between proof mass 22 and third electrodes 82. These changes in the distances cause changes in capacitances between proof mass 22 and third electrodes 82. Thus, measurements of the capacitances can be used to determine a measure of acceleration force 88 or other force being applied in Z-direction 76 to MEMS device 20.

As described above, MEMS device 20 can sense acceleration in three directions. In the preceding discussion, those three directions were described with reference to the coordinate labels X-direction 72, Y-direction 74, and X-direction 76 defined by three orthogonal axes X-axis 30, Y-axis 32, and Z-axis 34. It should be noted that the labeling of such directions and axes is arbitrary, and that other definitions and coordinate labeling systems could be used to describe the operation of such MEMS devices. It should be further noted that while these figures show an exemplary orientation of MEMS device 20 relative to the three defined directions and axes, that again is just one exemplary implementation.

The embodiment illustrated in FIGS. 1-5, provide small form factor, reliability and sensitivity by implementing a single proof mass for sensing in three orthogonal directions and by decoupling translatory sense motions. That is, sense motion in X-direction 72 is decoupled from sense motion in Y-direction 74 (e.g., no Y-direction 74 displacement of proof mass 22 in response to X-axis acceleration force 84) despite the asymmetric mass of proof mass 22.

Figure 6:
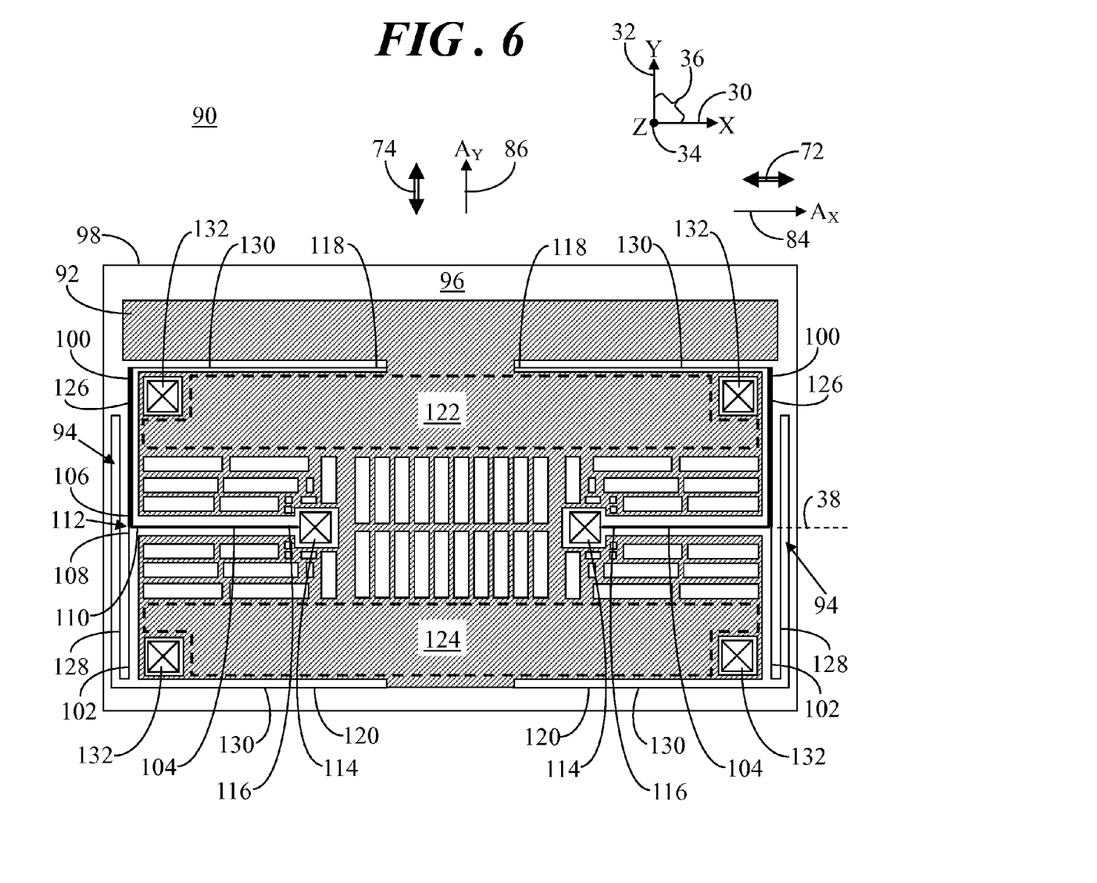
FIG. 6 shows a top view of a MEMS device in accordance with an exemplary implementation.

Referring now to FIG. 6, FIG. 6 shows a top view of a MEMS device 90 in accordance with an exemplary implementation. In particular, MEMS device 90 provides a particular example in which the stiffness of first translatory spring elements is greater than the stiffness of second translatory spring elements. MEMS device 90 generally includes a proof mass 92 and two suspension spring systems 94 configured to movably couple proof mass 92 to a surface 96 of a substrate 98. Proof mass 92 is shaded with rightwardly and upwardly directed hatching to better distinguish it from the surrounding features.

Each suspension spring system 94 includes a first translatory spring element 100, a second translatory spring element 102, and a torsion spring element 104. First translatory spring element 100 includes a first end 106, second translatory spring element 102 includes a second end 108, and torsion spring element 104 includes a first torsion spring end 110. First end 106, second end 108, and first torsion spring end 110 are coupled together, or conjoined, at a common region 112, or location, suspended above surface 96 of substrate 98. The electrodes positioned insides opening extending through proof mass 92 are not shown for simplicity. Again, MEMS device 90 is configured to determine force applied by acceleration in any of three orthogonal directions (X-direction 72, Y-direction 74, and Z-direction 76).

In the implementation of FIG. 6, anchor elements 114 are coupled to substrate 98 at rotational axis 38 for proof mass 92. Each torsion spring element 104 includes a second torsion spring end 116 coupled to its adjacent one of anchor elements 114. Additionally, each first translatory spring element 100 includes a third end 118 coupled with a greater mass first portion 122 of proof mass 92, and each second translatory spring element 102 includes a fourth end 120 coupled with a lower mass second portion 124 of proof mass 92.

First and second translatory spring elements 100 and 102 of spring suspension systems 94 facilitate translatory motion of proof mass 92 in X-direction 72 and Y-direction 74 in order to detect acceleration forces 84 and 86 in the corresponding X-direction 72 and Y-direction 74. Torsion spring elements 104 of spring suspension systems 94 facilitate teeter-totter like rotation of proof mass 92 about rotational axis 38. The asymmetric mass and rotation about rotational axis 38 enables proof mass 92 to detect acceleration in a Z-direction 76 (see FIG. 5).

To facilitate accurate acceleration determination in MEMS device 90, translatory spring elements 100 and 102 are configured to have asymmetric spring stiffness in response to forces in at least one direction. The asymmetric spring stiffness of translatory spring elements 100 and 102 is configured to compensate for the asymmetric mass of proof mass 92. Thus, the asymmetric spring stiffness is used to facilitate correct lateral motion of proof mass 92 in response to accelerations in X-direction 72 and/or Y-direction 74, and thus to facilitate accurate determinations of accelerations in those directions.

In an embodiment, first translatory spring elements 100 are implemented to have greater stiffness in X-direction 72 compared to the stiffness of second translatory spring elements 102 in X-direction 72. In an embodiment, a first X-direction stiffness of first translatory spring element 100 in X-direction 72 may be between ten and forty percent greater than a second X-direction stiffness of second translatory spring element 102 in X-direction 72. The amount of X-direction stiffness difference between first and second translatory spring elements 100 and 102 can be provided based upon the amount of mass asymmetry of proof mass 92. For example, the greater the mass asymmetry relative to rotational axis 38, the greater the X-direction stiffness difference between first and second translatory spring elements 100 and 102 should be provided to compensate for rotational moments created by the mass asymmetry.

In the embodiment illustrated in FIG. 6, proof mass 92 is substantially symmetric with respect to Y-axis 32 (i.e., on opposing sides of a centerline parallel to Y-axis 32). As such, first translatory spring elements 100 can have a Y-direction stiffness in Y-direction 74 that is substantially equal to the Y-direction stiffness of second translatory spring elements 102 in Y-direction 74. In this example, first and second translatory spring elements 100 and 102 have significant stiffness differences in one direction (i.e., X-direction 72) but have substantially equal stiffness in another, orthogonal direction (i.e., Y-direction 74). However, in alternative embodiments, translatory spring elements 100 and 102 may have different stiffness in both X-direction 72 and Y-direction 74.

The stiffness of a spring element in a particular direction (e.g., stiffness in X-direction 72, stiffness in Y-direction 74) corresponds to the resistance to deformation of the spring element that occurs in response to a force in that particular direction (e.g., force in X-direction 72, force in Y-direction 74). Stated another way, the stiffness of a spring element in each of the directions can be described quantitatively using a spring constant for each direction, where the spring constant for each direction can be expressed in the units of Newtons per meter (N/m).

Translatory spring elements 100 and 102 can be implemented using a variety of different types of spring elements. By way of example, translatory spring elements 100 and 102 can be implemented with bending beams, also referred to as folded beams, formed as part of the MEMS structure that enable translatory motion. Specifically, each of translatory spring elements 100 and 102 has flexible beams arranged with their major axis length arranged parallel to X-axis 30 and flexible beams arranged with their major axis length arranged parallel to Y-axis 32. In such bending spring elements, the stiffness in each direction is determined at least in part by the length, thickness, and/or number of bends in these flexible beams. Specifically, a fewer number of beam elements and bends corresponds to greater stiffness in the corresponding direction. Similarly, a thicker beam results in greater stiffness in the corresponding direction. Thus, to make a bending beam have greater stiffness in one direction compared to another bending beam, the length, thickness, and/or number of bends in these flexible beams can be configured to provide the relative stiffness.

As shown in FIG. 6, first translatory spring elements 100 are formed with less turns in flexible beams 126 and greater thickness that facilitate translatory motion in X-direction 72 as compared to the corresponding number of bends in and thickness of flexible beams 128 of second translatory spring elements 102 that facilitate translatory motion in X-direction 72. Conversely, due to the symmetry of proof mass 92 relative to Y-axis 32, each of first and second translatory spring elements 100 and 102 are formed with the same number of turns, thickness, and configuration of flexible beams 130 in the direction that facilitates translatory motion in Y-direction 74. Torsion spring elements 104 can likewise be implemented with bending beams configured to form torsion spring elements 104.

MEMS device 90 can further include travel stops 132 configured to restrain the translatory motion of proof mass 92. That is, travel stops 132 are implemented to prevent proof mass 92 from moving enough to impact and potentially damage the electrodes (not shown) located within each of the openings extending through proof mass 92. The use of travel stops 132 can improve the mechanical reliability of MEMS device 90 by reducing the effects of high impact loads on MEMS device 90.

Figure 7:
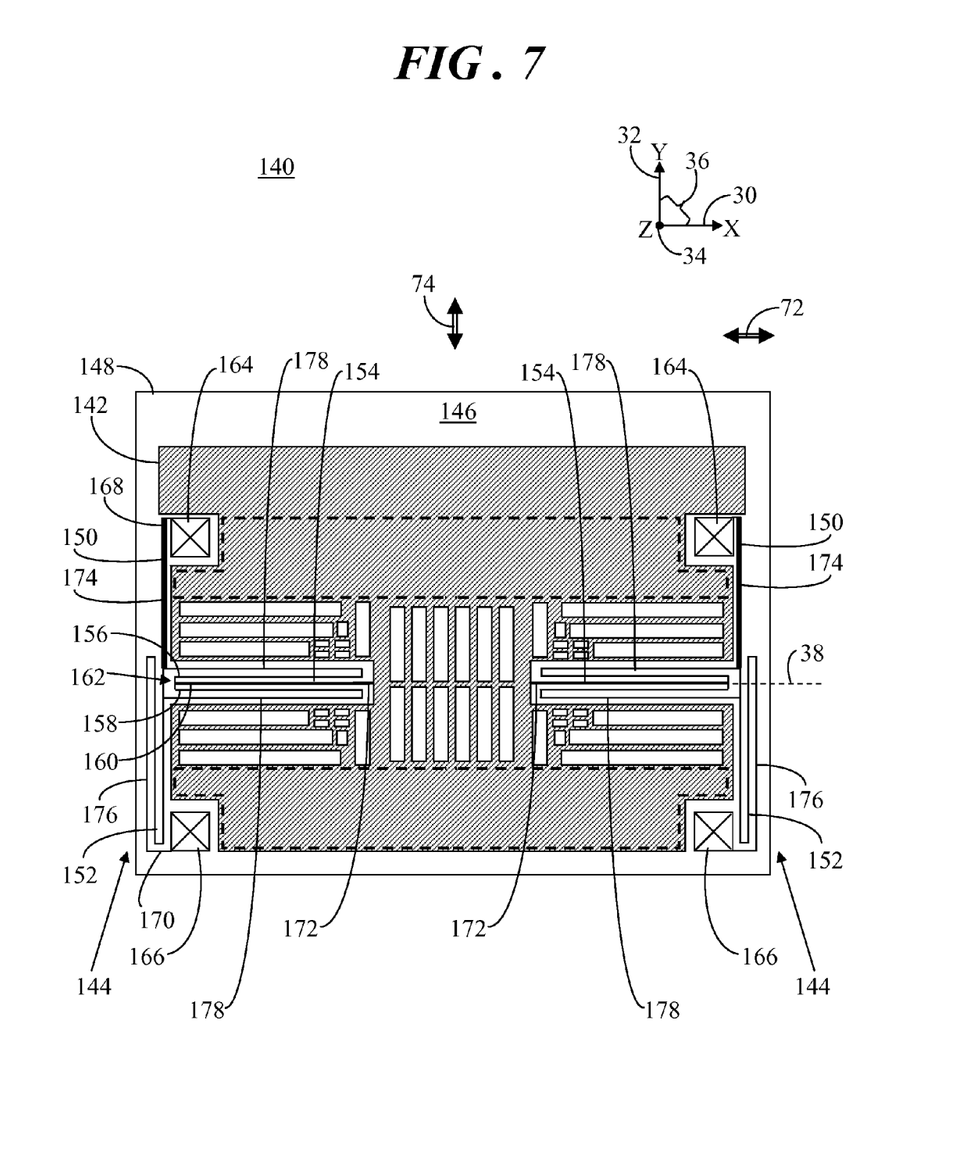
FIG. 7 shows a top view of a MEMS device in accordance with another exemplary implementation.

FIG. 7 shows a top view of a MEMS device 140 in accordance with another exemplary implementation. MEMS device 140 generally includes a proof mass 142 and two suspension spring systems 144 configured to movably couple proof mass 142 to a surface 146 of a substrate 148. Proof mass 142 is shaded with rightwardly and upwardly directed hatching to better distinguish it from the surrounding features.

Each suspension spring system 144 includes a first translatory spring element 150, a second translatory spring element 152, and a torsion spring element 154. First translatory spring element 150 includes a first end 156, second translatory spring element 152 includes a second end 158, and torsion spring element 154 includes a first torsion spring end 160. First end 156, second end 158, and first torsion spring end 160 are coupled together, or conjoined, at a common region 162, or location, suspended above surface 146 of substrate 148. Again, the electrodes inside openings extending through proof mass 142 are not shown for simplicity. MEMS device 140 is configured to determine force applied by acceleration in any of three orthogonal directions (X-direction 72, Y-direction 74, and Z-direction 76).

In the implementation of FIG. 7, first anchor elements 164 and second anchor elements 166 are coupled to substrate 148. First and second anchor elements 164 are displaced away from rotational axis 38 and are disposed on opposing sides of rotational axis 38. Each first translatory spring element 150 has a third end 168 coupled to its corresponding first anchor element 164, and each second translatory spring element 152 has a fourth end 170 coupled to its corresponding second anchor element 166. Each torsion spring element 154 has a second torsion spring end 172 coupled to proof mass 142 at rotational axis 38.

FIG. 6 shows an implementation in which the torsion spring elements are coupled to the anchor elements and the translatory spring elements are coupled to the proof mass. In contrast, FIG. 7 shows an implementation in which the translatory spring elements are coupled to the anchor elements and the torsion spring elements are coupled to the proof mass. In the implementation of FIG. 7, first and second anchor elements 164 and 166 can function as travel stops to restrain excessive translatory motion of proof mass due to their decentralized locations.

Like the previously described embodiments, first and second translatory spring elements 150 and 152 of spring suspension systems 144 facilitate translatory motion of proof mass 142 in X-direction 72 and Y-direction 74 in order to detect acceleration forces in the corresponding X-direction 72 and Y-direction 74. Torsion spring elements 154 of spring suspension systems 144 facilitate teeter-totter like rotation of proof mass 142 about rotational axis 38. The asymmetric mass and rotation about rotational axis 38 enables proof mass 142 to detect acceleration in a Z-direction 76.

To facilitate accurate acceleration determination in MEMS device 90, translatory spring elements 150 and 152 are configured to have asymmetric spring stiffness in response to forces in at least one direction. The asymmetric spring stiffness of translatory spring elements 150 and 152 is configured to compensate for the asymmetric mass of proof mass 142. Thus, the asymmetric spring stiffness is used to facilitate correct lateral motion of proof mass 142 in response to accelerations in X-direction 72 and/or Y-direction 74, and thus to facilitate accurate determinations of accelerations in those directions.

In an embodiment, first translatory spring elements 150 are implemented to have greater stiffness in X-direction 72 compared to the stiffness of second translatory spring elements 152 in X-direction 72. The amount of X-direction stiffness difference between first and second translatory spring elements 150 and 152 can be provided based upon the amount of mass asymmetry of proof mass 142 to compensate for rotational moments created by the mass asymmetry. In the embodiment illustrated in FIG. 7, proof mass 92 is substantially symmetric with respect to Y-axis 32 (i.e., on opposing sides of a centerline parallel to Y-axis 32). As such, first translatory spring elements 150 can have a Y-direction stiffness in Y-direction 74 that is substantially equal to the Y-direction stiffness of second translatory spring elements 152 in Y-direction 74.

Translatory spring elements 100 and 102 may be implemented with bending beams that enable translatory motion. Specifically, each of translatory spring elements 150 and 152 has flexible beams arranged with their major axis length arranged parallel to X-axis 30 and flexible beams arranged with their major axis length arranged parallel to Y-axis 32. As shown in FIG. 7, first translatory spring elements 150 are formed with less turns in and greater thickness of flexible beams 174 that facilitate translatory motion in X-direction 72 as compared to the corresponding number of bends in and thickness of flexible beams 176 of second translatory spring elements 152 that facilitate translatory motion in X-direction 72. Conversely, due to the symmetry of proof mass 142 relative to Y-axis 32, each of first and second translatory spring elements 150 and 152 are formed with the same number of turns and configuration of flexible beams 178 in the direction that facilitates translatory motion in Y-direction 74. Torsion spring elements 154 can likewise be implemented with bending beams configured to form torsion spring elements 154.

Figure 8:
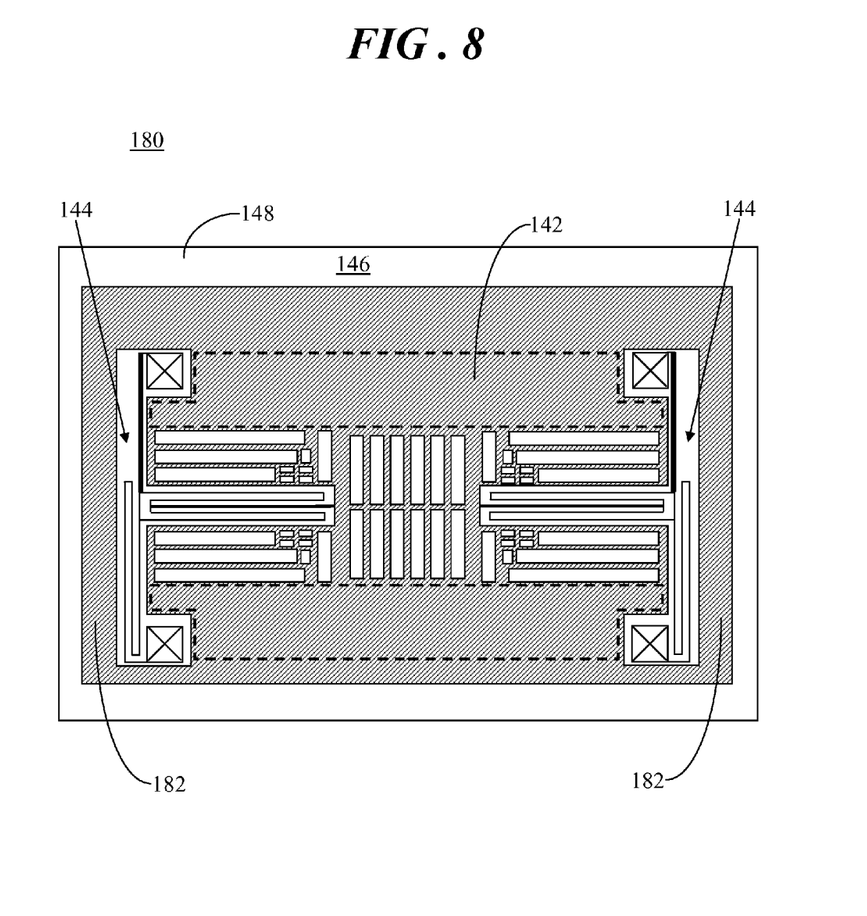
FIG. 8 shows a top view of a MEMS device in accordance with another exemplary implementation.

FIG. 8 shows a top view of a MEMS device 180 in accordance with another exemplary implementation. MEMS device 180 generally includes proof mass 142 and two suspension spring systems 144 configured to movably couple proof mass 142 to surface 146 of substrate 148. Consequently, description of proof mass 142 and suspension spring systems 144 is not repeated herein for brevity.

MEMS device 180 further includes an outer frame 182 spaced apart from surface 146 of substrate 148. Outer frame 182 is coupled to and surrounds proof mass 142 such that each of suspension spring systems 144 is interposed between proof mass 142 and outer frame 182. In some embodiments, outer frame 182 may be formed contiguous with proof mass 142. Outer frame 182 provides additional rigidity for proof mass 142 so that MEMS device 180 achieves increased robustness relative to MEMS device 140 (FIG. 4). Those skilled in the art should recognize that MEMS device 90 (FIG. 6) may alternatively be formed with an outer frame to provide additional rigidity to proof mass 92 (FIG. 6).

Thus, various embodiments of a MEMS device have been described. In one embodiment, MEMS device comprises a substrate, a movable element having a mass that is asymmetric relative to a rotational axis, and a suspension spring system configured to movably couple the movable element to the substrate. The suspension spring system includes a first translatory spring element, a second translatory spring element, and a torsion spring element. The first and second translatory spring elements are configured to facilitate translatory motion of the movable element relative to the substrate, and the torsion spring element is configured to facilitate rotation of the movable element about the rotational axis, wherein the first translatory spring element has a first stiffness and the second translatory spring element has a second stiffness. The first stiffness is greater than the second stiffness to compensate for moments created by the asymmetric mass of the movable element in response to translatory acceleration relative to the substrate in a first direction substantially parallel to a first axis.

Embodiments described herein entail MEMS accelerometer devices capable of sensing acceleration in three orthogonal directions (e.g., X-direction, Y-direction, and Z-direction) defined by three orthogonal axes (e.g., X-axis, Y-axis, and Z-axis). In general, the embodiments described herein can provide relatively small device size by facilitating the sharing of a single proof mass for sensing in all three directions. Furthermore, the embodiments described herein can provide this relatively small device size while still providing relatively good sensitivity by decoupling the sense motions in two directions (e.g., the X-direction and the Y-direction). This decoupling is facilitated by the use of translatory spring elements that have asymmetric stiffness configured to compensate for an asymmetric mass used to sense in the third direction (e.g., the Z-direction).

While the principles of the inventive subject matter have been described above in connection with specific device configurations, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A microelectromechanical systems (MEMS) device comprising:
    a substrate;
    a movable element having a mass that is asymmetric relative to a rotational axis; and
    a suspension spring system configured to movably couple said movable element to said substrate, said suspension spring system including a first translatory spring element, a second translatory spring element, and a torsion spring element, wherein said first and second translatory spring elements are configured to facilitate translatory motion of said movable element relative to said substrate, and said torsion spring element is configured to facilitate rotation of said movable element about said rotational axis, wherein:

said first translatory spring element has a first stiffness; and said second translatory spring element has a second stiffness, said first stiffness being greater than said second stiffness to compensate for moments created by said asymmetric mass of said movable element in response to translatory acceleration relative to said substrate in a first direction substantially parallel to a first axis.

2. The MEMS device of claim 1 wherein:

said translatory motion of said movable element relative to said substrate is in said first direction and in a second direction, said first and second directions being substantially parallel to a surface of said substrate, and said second direction being substantially orthogonal to said first direction;

said rotation of said movable element about said rotational axis comprises rotation about said first axis; and said first stiffness and said second stiffness define stiffness in said first direction.

3. The MEMS device of claim 1 wherein:

said translatory motion of said movable element relative to said substrate is in said first direction and in a second direction, said first and second directions being substantially parallel to a surface of said substrate, and said second direction being substantially orthogonal to said first direction;

said first direction comprises an X-direction defined by an X-axis;

said second direction comprises a Y-direction defined by a Y-axis;

said first stiffness of said first translatory spring element includes a first X-direction stiffness and a first Y-direction stiffness;

said second stiffness of said second translatory spring element includes a second X-direction stiffness and a second Y-direction stiffness;

said first X-direction stiffness is substantially greater than said second X-direction stiffness; and said first Y-direction stiffness is substantially equal to said second Y-direction stiffness.

4. The MEMS device of claim 1 wherein said first stiffness is between ten and forty percent greater than said second stiffness.

5. The MEMS device of claim 1 wherein:

said movable element includes a first portion positioned on a first side of said rotational axis and a second portion positioned on a second side of said rotational axis, said first portion having greater mass than said second portion;

said first translatory spring element is adapted to facilitate said translatory motion of said first portion;

said second translatory spring element is adapted to facilitate said translatory motion of said second portion such that said movable element moves substantially linearly in response to said translatory acceleration in said first direction.

6. The MEMS device of claim 1 wherein:

said first translatory spring element has a first end;

said second translatory spring element has a second end; and said torsion spring has a first torsion spring end, wherein said first end, said second end, and said first torsion spring end are coupled together at a common region suspended above said substrate.

7. The MEMS device of claim 6 further comprising an anchor element coupled to said substrate at said rotational axis, wherein said torsion spring has a second torsion spring end coupled to said anchor element, said first translatory spring element has a third end coupled with a first portion of said movable element, and said second translatory spring element has a fourth end coupled with a second portion of said movable element, said first and second portions being disposed on opposing sides of said rotational axis.

8. The MEMS device of claim 6 further comprising:

a first anchor element coupled to said substrate; and a second anchor element coupled to said substrate, said first and second anchor elements being disposed on opposing sides of said rotational axis, wherein said first translatory spring element has a third end coupled to said first anchor element, said second translatory spring element has a fourth end coupled to said second anchor element, and said torsion spring element includes a second torsion spring end coupled to said movable element at said rotational axis.

9. The MEMS device of claim 8 wherein said first and second anchor elements are displaced away from said rotational axis by an equivalent distance.

10. The MEMS device of claim 1 further comprising a plurality of travel stops configured to restrain said translatory motion of said movable element.

11. The MEMS device of claim 1 further comprising:

a first electrode coupled to said substrate and positioned proximate said movable element such that a first capacitance between said first electrode and said movable element varies in response to displacement of said movable element along said first direction; and a second electrode coupled to said substrate and positioned proximate said movable element such that a second capacitance between said second electrode and said movable element varies in response to displacement of said movable element along a second direction, wherein said first and second directions are substantially parallel to a surface of said substrate, and said second direction is substantially orthogonal to said first direction.

12. The MEMS device of claim 11 further comprising a third electrode coupled to said substrate underlying said movable element, wherein a third capacitance between said third electrode and said movable element varies in response to displacement of said movable element about said rotational axis.

13. The MEMS device of claim 1 further comprising outer frame spaced apart from said substrate, said outer frame being coupled to and surrounding said movable element such that said suspension spring system is interposed between said outer frame and said movable element.

14. A microelectromechanical systems (MEMS) device comprising:

a substrate;

a movable element having mass that is asymmetric relative to a rotational axis, said movable element having a first portion positioned on a first side of said rotational axis and a second portion positioned on a second side of said rotational axis, said first portion having greater mass than said second portion; and a suspension spring system configured to movably couple said movable element to said substrate, said suspension spring system including a first translatory spring element, a second translatory spring element, and a torsion spring element, wherein said first translatory spring element is adapted to facilitate translatory motion of said first portion of said movable element relative to said substrate in a first direction substantially parallel to a first axis, said second translatory spring element is adapted to facilitate said translatory motion of said second portion of said movable element relative to said substrate in said first direction, and said torsion spring element is configured to facilitate rotation of said movable element about said rotational axis, wherein:

said first translatory spring element has a first stiffness; and said second translatory spring element has a second stiffness, said first stiffness being greater than said second stiffness to compensate for moments created by said asymmetric mass of said movable element in response to translatory acceleration relative to said substrate in said first direction such that said movable element moves substantially linearly in response to said translatory acceleration in said first direction, said first stiffness and said second stiffness defining stiffness in said first direction; and said rotation of said movable element about said rotational axis comprises rotation about said first axis.

15. The MEMS device of claim 14 wherein:

said translatory motion of said movable element relative to said substrate is in said first direction and in a second direction, said first and second directions being substantially parallel to a surface of said substrate, and said second direction being substantially orthogonal to said first direction;

said first direction comprises an X-direction defined by an X-axis;

said second direction comprises a Y-direction defined by a Y-axis;

said first stiffness of said first translatory spring element includes a first X-direction stiffness and a first Y-direction stiffness;

said second stiffness of said second translatory spring element includes a second X-direction stiffness and a second Y-direction stiffness;

said first X-direction stiffness is substantially greater than said second X-direction stiffness; and said first Y-direction stiffness is substantially equal to said second Y-direction stiffness.

16. The MEMS device of claim 14 further comprising:

a first electrode coupled to said substrate and positioned proximate said movable element such that a first capacitance between said first electrode and said movable element varies in response to displacement of said movable element along said first direction; and a second electrode coupled to said substrate and positioned proximate said movable element such that a second capacitance between said second electrode and said movable element varies in response to displacement of said movable element along a second direction, wherein said first and second directions are substantially parallel to a surface of said substrate, and said second direction is substantially orthogonal to said first direction.

17. The MEMS device of claim 14 further comprising a third electrode coupled to said substrate underlying said movable element, wherein a third capacitance between said third electrode and said movable element varies in response to displacement of said movable element about said rotational axis.

18. A microelectromechanical systems (MEMS) device comprising:

a substrate;

a movable element having a mass that is asymmetric relative to a rotational axis; and a suspension spring system configured to movably couple said movable element to said substrate, said suspension spring system including:

a first translatory spring element having a first stiffness and a first spring end;

a second translatory spring element having a second stiffness and a second spring end, said first and second translatory spring elements being configured to facilitate translatory motion of said movable element relative to said substrate, and said first stiffness being greater than said second stiffness to compensate for moments created by said asymmetric mass of said movable element in response to translatory acceleration relative to said substrate in a first direction substantially parallel to a first axis; and a torsion spring element having a first torsion spring end, wherein said first end, said second end, and said first torsion spring end are coupled together at a common region suspended above said substrate, and said torsion spring element is configured to facilitate rotation of said movable element about said rotational axis, wherein said rotation of said movable element about said rotational axis comprises rotation about said first axis.

19. The MEMS device of claim 18 further comprising an anchor element coupled to said substrate at said rotational axis, wherein said torsion spring has a second torsion spring end coupled to said anchor element, said first translatory spring element has a third end coupled with a first portion of said movable element, and said second translatory spring element has a fourth end coupled with a second portion of said movable element, said first and second portions being disposed on opposing sides of said rotational axis.

20. The MEMS device of claim 18 further comprising:

a first anchor element coupled to said substrate; and a second anchor element coupled to said substrate, said first and second anchor elements being disposed on opposing sides of said rotational axis, wherein said first translatory spring element has a third end coupled to said first anchor element, said second translatory spring element has a fourth end coupled to said second anchor element, and said torsion spring element includes a second torsion spring end coupled to said movable element at said rotational axis.

* * * * *